United States Patent
Kim et al.

(10) Patent No.: US 10,553,830 B2
(45) Date of Patent: Feb. 4, 2020

(54) FABRICATION OF PHOSPHOR FILM WITH HEAT DISSIPATION FILM

(71) Applicant: SABIC Global Technologies B.V., Bergen op Zoom (NL)

(72) Inventors: Sang Hoon Kim, Seoul (KR); Hoo Keun Park, Seoul (KR)

(73) Assignee: SABIC Global Technologies B.V., Bergen op Zoom (NL)

( * ) Notice: Subject to any disclaimer, the term of this patent is extended or adjusted under 35 U.S.C. 154(b) by 0 days.

(21) Appl. No.: 16/313,506

(22) PCT Filed: Jun. 26, 2017

(86) PCT No.: PCT/IB2017/053805
§ 371 (c)(1),
(2) Date: Dec. 27, 2018

(87) PCT Pub. No.: WO2018/002809
PCT Pub. Date: Jan. 4, 2018

(65) Prior Publication Data
US 2019/0341573 A1    Nov. 7, 2019

Related U.S. Application Data

(60) Provisional application No. 62/355,972, filed on Jun. 29, 2016.

(51) Int. Cl.
*H01L 51/00* (2006.01)
*H01L 51/52* (2006.01)
(Continued)

(52) U.S. Cl.
CPC .......... *H01L 51/529* (2013.01); *H01L 33/507* (2013.01); *H01L 33/56* (2013.01);
(Continued)

(58) Field of Classification Search
None
See application file for complete search history.

(56) References Cited

U.S. PATENT DOCUMENTS

| | | |
|---|---|---|
| 5,897,727 A | 4/1999 | Staral et al. |
| 7,196,354 B1 | 3/2007 | Erchak et al. |

(Continued)

FOREIGN PATENT DOCUMENTS

| | | |
|---|---|---|
| CN | 1691360 A | 11/2005 |
| CN | 102790162 A | 11/2012 |

(Continued)

OTHER PUBLICATIONS

International Patent Application No. PCT/IB2017/053805; Int'l Search Report and the Written Opinion; dated Oct. 4, 2017; 16 pages.

(Continued)

Primary Examiner — Reema Patel
(74) Attorney, Agent, or Firm — Baker Hostetler

(57) ABSTRACT

A light emitting device and processes for making the same are disclosed. In an aspect, a light-emitting device comprises a substrate, a light emitting diode disposed adjacent the substrate, a color conversion layer disposed adjacent a side of the substrate opposite the light emitting diode, and a heat dissipation layer disposed adjacent the color conversion layer, wherein one or more of the color conversion layer and the heat dissipation layer are formed using adhesive transfer, and wherein the light-emitting device exhibits improved thermal stability and power efficiency as compared to a comparative light-emitting device consisting essentially of the substrate, the light emitting diode, and the color conversion layer without the heat dissipation layer.

16 Claims, 10 Drawing Sheets

(51) Int. Cl.
  *H01L 33/56* (2010.01)
  *H01L 51/50* (2006.01)
  *H01L 33/50* (2010.01)
  *H01L 33/64* (2010.01)
(52) U.S. Cl.
  CPC .......... *H01L 33/641* (2013.01); *H01L 33/644* (2013.01); *H01L 51/504* (2013.01); *H01L 33/505* (2013.01); *H01L 2251/5369* (2013.01); *H01L 2933/0041* (2013.01)

(56) References Cited

U.S. PATENT DOCUMENTS

| | | |
|---|---|---|
| 7,294,861 B2 | 11/2007 | Schardt et al. |
| 7,326,949 B2 | 2/2008 | Takasu et al. |
| 9,028,083 B2 | 5/2015 | Ouderkirk et al. |
| 2010/0133556 A1 | 6/2010 | Li et al. |
| 2011/0100425 A1 | 5/2011 | Osamura et al. |
| 2014/0226335 A1 | 8/2014 | Menkara |
| 2016/0005933 A1 | 1/2016 | Chang et al. |

FOREIGN PATENT DOCUMENTS

| | | |
|---|---|---|
| CN | 203386790 U | 1/2014 |
| EP | 1589591 A2 | 10/2005 |
| WO | 2014148792 A1 | 9/2014 |
| WO | 20170051316 A1 | 3/2017 |

OTHER PUBLICATIONS

International Patent Application No. PCT/IB2017/053805; Int'l Preliminary Report on Patentability; dated Sep. 25, 2018; 18 pages.

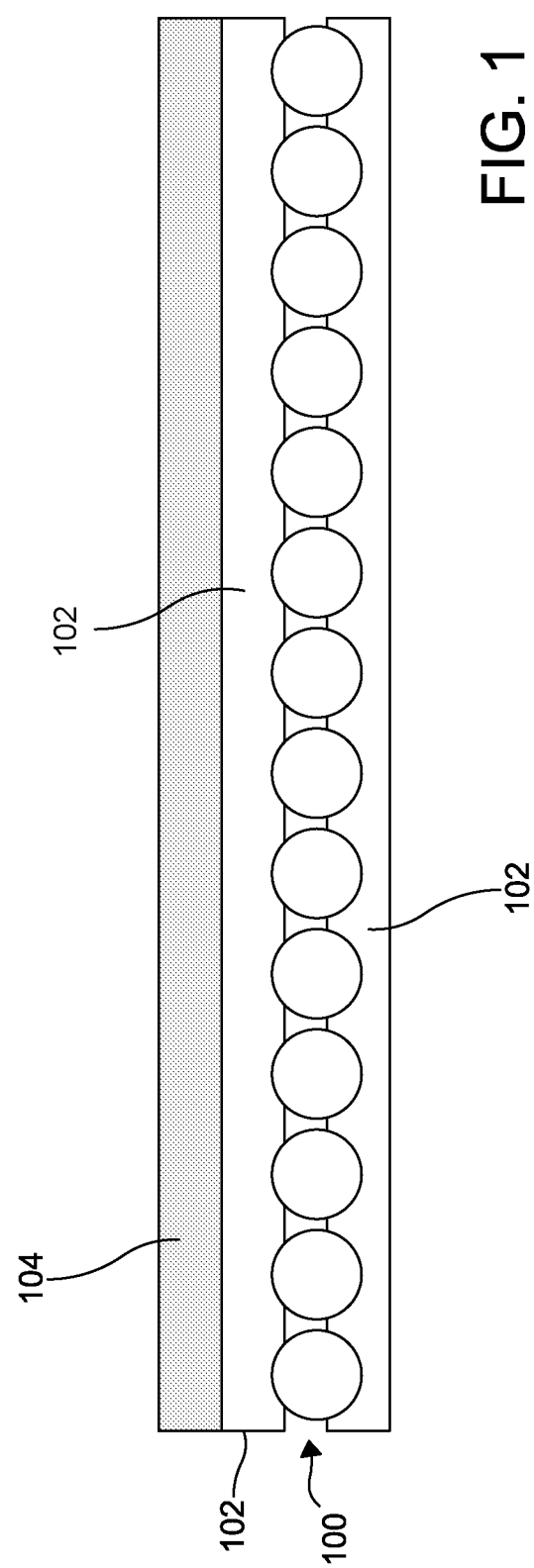

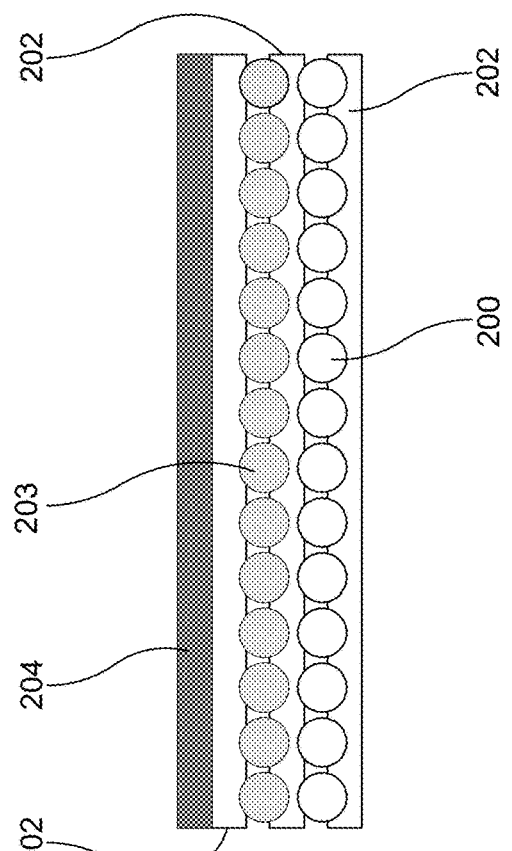
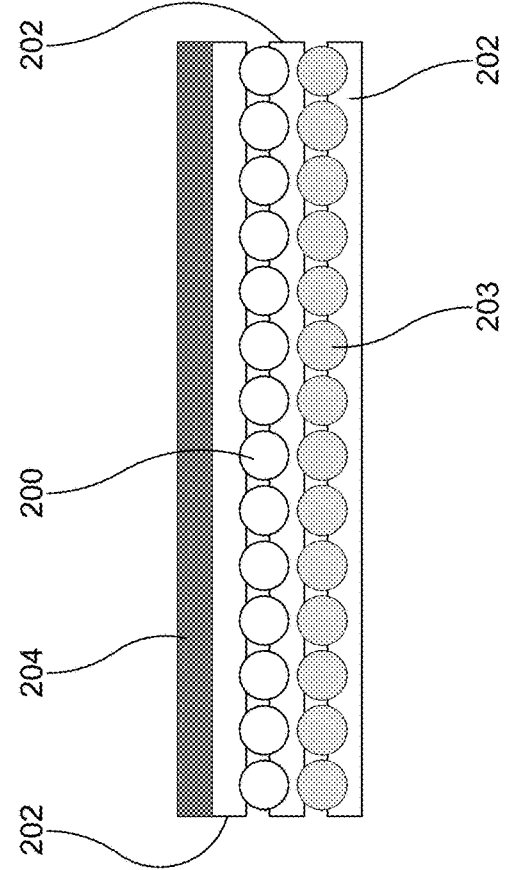

| | Thermal Conductivity (W/m*K) | |
|---|---|---|
| | 25 °C | 120 °C |
| CCL_550(1) | 0.148 | 0.157 |
| CCL_550(1)_P | 0.143 | 0.147 |
| CCL_550(2) | 0.168 | 0.165 |
| Adhesive Layer | 0.140 | 0.155 |

FIG. 6

| ITEM | | GRADE | SGP | MGP | GP | HGP | SP-2 | SP-3 |
|---|---|---|---|---|---|---|---|---|
| COMPOSITION | BN | (%) | 99 | 99 | 99 | 99 | 97 | 98 |
| | B2O3 | (%) | 0.1 | 0.1 | 0.1 | 0.2 | 0.2 | 0.1 |
| | T-O | (%) | 0.3 | 0.4 | 0.5 | 1.0 | 1.8 | 0.7 |
| | T-C | (%) | <0.1 | <0.1 | <0.1 | <0.1 | <0.1 | <0.1 |
| PROPERTIES | SSA | (m2/g) | 2 | 3 | 8 | 11 | 34 | 17 |
| | D50 | (μm) | 18 | 10 | 8 | 5 | 4 | 4 |
| | Density | (g/cm3) | 0.8 | 0.8 | 0.5 | 0.4 | 0.4 | 0.4 |
| SEM Image | | | | | | | | |

SSA: Specific Surface Area  Density: Tapping Density  T-C: Total Carbon
D50: Average Particle Size  T-O: Total Oxygen

FIG. 7

| SAMPLE | | EQE (%) | PE (lm/W) | Sample | EQE (%) | PE (lm/W) |
|---|---|---|---|---|---|---|
| | LED Ref | 0.42 | 105.5 | Ref | 0.42 | 105.5 |
| BN | ST-SGP-Down | 0.36 | 79.6 | Mx-SGP-Down | 0.38 | 95.4 |
| | ST-SGP-Down | 0.42 | 102.3 | Mx-GP-Down | 0.32 | 79.1 |
| | ST-SG-3-Down | 0.38 | 92.3 | Mx-SP-3-Down | 0.28 | 0.38 |
| | ST-SGP-Up | 0.40 | 115.6 | Mx-SGP-Up | 0.40 | 118.4 |
| | ST-GP-Up | 0.41 | 120.5 | Mx-GP-Up | 0.36 | 113.8 |
| | ST-SP-3-Up | 0.41 | 118.0 | Mx-SP-3-Up | 0.33 | 112.0 |

FIG. 8

FABRICATION OF PHOSPHOR FILM WITH HEAT DISSIPATION FILM

CROSS-REFERENCE TO RELATED APPLICATION

This application is the National Stage of International Application No. PCT/IB2017/053805, filed Jun. 26, 2017, which claims the benefit of U.S. Provisional Application No. 62/355,972 filed Jun. 29, 2016, the disclosures of which are incorporated herein by this reference in their entireties.

TECHNICAL FIELD

The disclosure generally relates to light emitting device such as organic light emitting devices (OLEDs), and more particularly to methods and structures utilizing a phosphor film and/or a heat dissipation film.

BACKGROUND

Display and lighting systems based on organic light emitting devices (OLEDs) have a variety of applications. The construction of OLED light sources and OLED displays from individual OLED elements or devices is well known in the art. A light-emitting layer of a luminescent organic solid, as well as optional adjacent semiconductor layers, is sandwiched between a cathode and an anode. The light-emitting layer may be selected from any of a multitude of fluorescent organic solids. The light-emitting layer may consist of multiple sub-layers or a single blended layer.

When a potential difference is applied across the anode and cathode, electrons move from the cathode to the optional electron-injecting layer and finally into the layer(s) of organic material. At the same time, holes move from the anode to the optional hole-injecting layer and finally into the same organic light-emitting layer(s). When the holes and electrons meet in the layer(s) of organic material, they combine, and produce photons. The wavelength of the photons depends on the material properties of the organic material in which the photons are generated. The color of light emitted from the OLED can be controlled by the selection of the organic material, or by the selection of dopants, or by other techniques known in the art.

Different colored light may be generated by mixing the emitted light from different OLEDs. For example, white-emitting OLED-lighting systems can be generated by applying a continuous down-conversion layer on the light emitting side of a blue OLED. The down-conversion layer comprises of a color changing material, for example phosphor particles.

In a typical OLED, either the anode or the cathode is transparent in order to allow the emitted light to pass through. If it is desirable to allow light to be emitted from both sides of the OLED, both the anode and cathode can be transparent.

The basic OLED has a structure in which an anode, an organic light emitting layer, and a cathode are consecutively laminated, with the organic light emitting layer sandwiched between the anode and the cathode. Generally, electrical current flowing between the anode and cathode passes through points of the organic light emitting layer and causes it to luminesce. The electrode positioned on the surface through which light is emitted is formed of a transparent or semi-transparent film. The other electrode is formed of a specific thin metal film, which can be a metal or an alloy.

Generally, phosphor has been used as a color conversion layer (CCL) in the fields of display and lighting applications such as light emitting diodes (LEDs), OLED, and the like. In particular, the use of phosphor in down conversion may be used to create white light. The combination of the light emitted from the phosphor material and the unabsorbed light from a blue emitting layer has been used considerably in white LED and OLED. However, such phosphor undergoes the reducing of luminous efficiency and the drifting of color coordinates due to heat and junction temperature when it is applied to high-power white LED. As such, the thermal stability of the phosphor has an important effect on the optical properties as the major luminescent material of white LED and OLED. In addition, phosphor may generate a yellowish color when the device is in an off-state due to absorption of ambient light and conversion of white color into yellow. This phenomena is undesirable from the aesthetic point of view.

These and other shortcomings of the prior art are addressed by the present disclosure.

SUMMARY

In accordance with one aspect of the disclosure, a light-emitting device comprises a substrate, a light emitting diode disposed adjacent the substrate, a color conversion layer disposed adjacent a side of the substrate opposite the light emitting diode, and a heat dissipation layer disposed adjacent the color conversion layer, wherein one or more of the color conversion layer and the heat dissipation layer are formed using adhesive transfer, and wherein the light-emitting device exhibits improved thermal stability and power efficiency as compared to a comparative light-emitting device consisting essentially of the substrate, the light emitting diode, and the color conversion layer without the heat dissipation layer.

BRIEF DESCRIPTION OF THE DRAWINGS

The above-mentioned and other features and advantages of this disclosure, and the manner of attaining them, will become apparent and be better understood by reference to the following description of one aspect of the disclosure in conjunction with the accompanying drawings, wherein:

FIG. 1 is a schematic representation of a composite layered structure according to aspects of the present disclosure.

FIGS. 2A-2B is a schematic representation of a composite layered structure according to aspects of the present disclosure.

FIG. 6 is a table of example thermal conductivity measurements according to aspects of the present disclosure.

FIG. 7 is a table of properties for various materials that may be used for heat dissipation layers according to aspects of the present disclosure.

FIG. 8 is a table of example external quantum efficiency and power efficiency measurements according to aspects of the present disclosure.

DETAILED DESCRIPTION

Figure 3B:
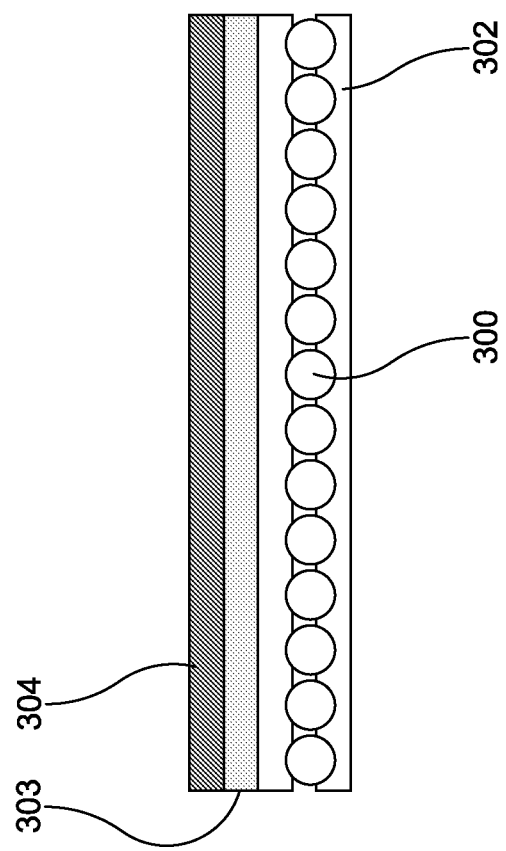
FIGS. 3A-3B is a schematic representation of a composite layered structure according to aspects of the present disclosure.

The structures and methods of the present disclosure include a phosphor film with high thermal conductivity and whitening effect for white LED and OLED devices. Such phosphor film may be fabricated using adhesive transfer (AT) method with heat dissipation powders (such as for example, boron nitride BN and aluminum nitride AlN). The heat dissipation powder may improve the thermal conductivity and the whitening of the exterior color from the phosphor film. This multifunctional phosphor film can be applied to white LED and OLED device applications, and future industrial applications.

Using an AT method with an optically clear adhesive (OCA) layer, the phosphor film and heat dissipation film maybe fabricated, and the combination of phosphor film and heat dissipation film is realized. In addition, more than two layers could coated using the AT method. The phosphor film with heat dissipation film can exhibit the high thermal stability and white exterior color as well as the enhanced efficiency because of scattering effect of heat dissipation powders, compared to the phosphor film without heat dissipation film. As a result, a higher efficiency and more attractive white LED and OLED device may be realized by adding the heat dissipation film to the powder film.

In some aspects, the substrate may be or comprise an optically clear resin or adhesive, metal, film, glass, ceramic, paper or combinations thereof. Specific examples of the substrate may include, but are not limited to, a plate or a foil of metal such as aluminum (including aluminum alloy), zinc, copper and iron; a film made of plastic such as cellulose acetate, polyethylene terephthalate (PET), polyethylene, polyester, polyamide, polyimide, polystyrene, polypropylene, polycarbonate, polyvinyl acetal, aramid and polyphenylene sulfide; and paper having plastic (polyethylene, polypropylene, polystyrene, or the like) laminated thereon or paper coated with plastic (polyethylene, polypropylene, polystyrene, or the like), paper or a plastic film having the above-mentioned metal laminated thereon or vapor-deposited thereon.

The phosphor film includes a resin material and a phosphor material. The phosphor film comprises a phosphor material that advantageously includes a combination of phosphor microparticles and phosphor nanoparticles. The phosphor microparticles may be sized from 1 micrometers (microns, μm) to 10 μm, or from about 1 μm to about 10 μm. The phosphor nanoparticles may be sized from 10 nanometers (nm) to 900 nm, or from about 10 nm to about 900 nm.

In one aspect of the disclosure, the phosphor material is configured to convert light emitted by a light source such as a light-emitting diode (LED) into light having a different wavelength. For example, the phosphor material may be configured to convert the light emitted by an LED to a higher or lower wavelength as needed. In one aspect, the phosphor material may be used to form a color conversion layer in a light-emitting device. For example, if an LED emits blue light in the blue spectral range of 450-490 nanometers (nm), then the color conversion layer may contain a layer of phosphor material for converting some of this radiation to a different spectral range. Preferably, the phosphor material is configured to convert most or all of the radiation from the LED to the desired spectral range. Phosphor materials suitable for this purpose are generally known in the art and may include, but are not limited to inorganic materials such as yttrium aluminum garnet (YAG) phosphors.

The phosphor material may include red-emitting phosphors, green-emitting phosphors, and yellow-emitting phosphors. In one aspect, the phosphor material may comprise a mixture of red-emitting phosphor, green-emitting phosphor and yellow-emitting phosphor.

The phosphor material is typically in the form of a solid powder. The phosphor powder may be composed of a mixture of phosphor particles, phosphor microparticles, phosphor nanoparticles or combinations thereof. The phosphor particles or phosphor microparticles may have an average diameter that ranges in size from 1 micron to 100 microns, or from about 1 micron to about 100 microns. In one aspect of the present disclosure, the average diameter of the phosphor particles is less than 50 microns. In another aspect of the present disclosure, the average diameter of the phosphor particles is less than 20 microns. In yet another aspect of the present disclosure, the average diameter of the phosphor particles is less than 10 microns. In yet another aspect of the present disclosure, the average diameter of the phosphor nanoparticles used in the phosphor powder ranges from 10 nm to 900 nm, or from about 10 nm to about 900 nm. The size of the phosphor particles is generally selected based on the desired thickness of the phosphor film and the overall thickness of the composite layered structure or the light-emitting device. The term "phosphor particle" as used herein encompasses particles of any size or dimension that are composed of phosphor material, including nanoparticles and microparticles as well as larger sized particles.

In some aspects of the disclosure, the surface packing density of the phosphor material in the phosphor film may range from 90% to 97%, or from about 90% to about 97%. As explained in further detail below, higher surface packing densities of phosphor film offer certain advantageous such as thinner film layers and improved color quality. The packing density of the phosphor material in the phosphor film is typically due to a number of variables including the density of the phosphor material in the film layer, the average particle size, particle size distribution and particle shape.

In some aspects of the disclosure, the phosphor material is present in the phosphor film from 90% to 99% by weight, or from about 90% to about 99% by weight, based on the total weight of the phosphor film. In some aspects, the phosphor film has a thickness that ranges from 20 μm to 40 μm, or from about 20 pun to about 40 μm.

The phosphor film further includes a resin material. The resin material used in the present disclosure is a resin material that is suitable for containing a phosphor material therein, and for forming a film. Accordingly, any resin material may be employed as the resin material as long as it allows the phosphor material to be uniformly dispersed therein and can form a film. A uniform distribution of the phosphor powder in the resin material and throughout the phosphor film is generally preferred to achieve a consistent color quality of light from a light-emitting device. In some aspects, the resin material is present in the phosphor film from 1% to 10% by weight, or from about 1% to about 10% by weight, based on the total weight of the phosphor film.

Specific examples of the resin material include a silicone resin, an epoxy resin, a poly allylate resin, a PET modified poly allylate resin, a polycarbonate (PC) resin, cyclic olefin, a polyethylene terephthalate (PET) resin, a polymethylmethacrylate (PMMA) resin, a polypropylene (PP) resin, modified acryl resin, a polystyrene (PE) resin, and an acrylonitrile-styrene copolymer (AS) resin. The resin material may include combinations or mixtures of these and/or other suitable materials. For example, additives may be added to the resin material to improve or alter certain properties of the phosphor film as needed.

In some aspects of the present disclosure, the resin material may be transparent or translucent. In one aspect, silicone resin or epoxy resin may be preferred as a resin material because they are transparent. Furthermore, the silicone resin may be particularly preferable as a resin material because of its heat resistant properties.

In another aspect of the present disclosure, the resin material may be curable. For example, the resin material may be an ultraviolet (UV)-curable or thermally curable resin. The resin material may also in some aspects include a curing agent for this purpose. Other suitable film forming methods known in the art may be used to form the phosphor film and the disclosure is not limited in this regard. These methods may include but are not limited to, molding, casting and extrusion techniques. The phosphor film may be spray deposited, spun, deposited by electrophoresis or formed by any other technique. In one aspect of the disclosure, these methods may be used in combination with the adhesive transfer method disclosed herein.

Figure 9:
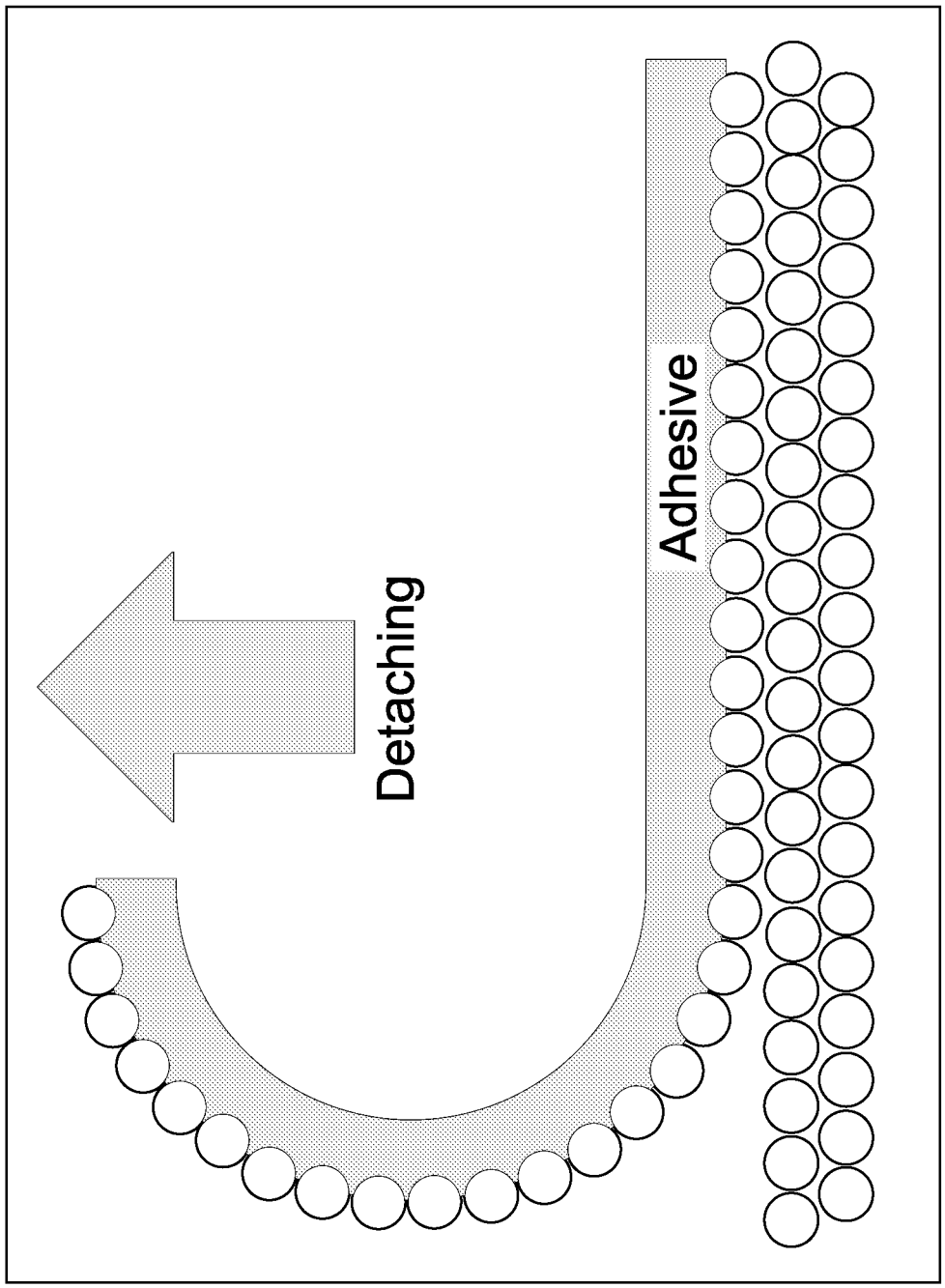
FIG. 9 is a schematic representation of an adhesive transfer method according to aspects of the present disclosure.

In some aspects, the one or more layers of phosphor film are used as a color conversion layer. Color conversion layers are known to be useful for generating white light by having an LED emitting light of a first color and mixing this light with light of a second color generated by partially converting the light having the first color. For example, FIG. 9 schematically illustrates the fabrication of a color conversion layer by an adhesive transfer method. As explained in further detail below, the adhesive transfer method makes it possible to apply more than one layer of phosphor film to a substrate.

In one aspect of the disclosure, the color conversion layer may have only one layer of phosphor film. In another aspect, the color conversion layer may have more than one layer of phosphor film. For example, a color conversion layer may have two layers of phosphor film or three layers of phosphor film. The number of layers of phosphor film is not limited in this regard.

The layers of phosphor film may be applied to the substrate using an adhesive transfer method. In the adhesive transfer method, phosphor film is initially provided on a support layer used for the transfer of the phosphor film layer. The phosphor film may be provided on the support layer using any means known in the art. For example, the phosphor film may be applied to the support layer by coating, spraying, extruding, etc. In some aspects, an adhesive may also be used to attach the phosphor film to the support layer. It is generally preferred, however, that the phosphor film is weakly attached to the support layer. A weak attachment of the phosphor film to the support layer will promote the release of the support layer later in the transfer process, whereas a strong attachment or bond between the phosphor film layer and the support layer may make it more difficult to remove the phosphor film from the support layer.

The support layer is not limited and is configured to be detached from the phosphor film such that the support layer is not part of the composite layered structure. The support layer may include a release layer on the surface of the support layer that is also in direct contact with the phosphor film. The release layer may be present to assist with and facilitate the separation of the phosphor film from the support layer during the transfer process. Suitable materials for the release layer may include but are not limited to silicones, polycarbonates, and polyacrylates.

In one aspect of the disclosure, an adhesive material may be deposited on the surface of the phosphor film opposite the support layer. The adhesive material is provided solely to facilitate the transfer of the phosphor film to the substrate or to other phosphor film layers such that the composite layered structure is formed. The adhesive material may be deposited on the entire surface area of the phosphor film such that an adhesive layer or coating is formed. Alternatively, the adhesive material may be deposited on only a portion of the phosphor film surface. The adhesive material is generally deposited as needed to adhere the phosphor film to the substrate. It is generally preferred that the adhesive material is not deposited on the periphery edges of the phosphor film and the support layer because it may make it more difficult to detach the phosphor film from the support layer. In some aspects, the adhesive material may be a wax, resin, or glue. In other aspects, the adhesive material may include a metal or an alloy.

In some aspects of the disclosure, the adhesive material may be deposited on the surface of the substrate in addition to the surface of the phosphor film. In yet other aspects of the disclosure, the adhesive material may be deposited on the surface of the substrate instead of the surface of the phosphor film.

The phosphor film may then be transferred to the substrate to form the composite layered structure after the adhesive material is applied. For example, the surface of the phosphor film to be transferred may be contacted with the surface of the substrate. At least one of these surfaces of the substrate and the phosphor film or both will have some adhesive material to assist with bonding the surfaces together. In some aspects, placing the two surfaces in direct contact with each other may adhere the phosphor film to the substrate. In other aspects, pressure may be applied or a heat treatment may be needed. Other techniques for bonding may also be used.

Once bonded, the phosphor film layer may be separated from the support layer to complete the transfer of the phosphor film layer to the substrate or the composite layered structure. The separation of the support layer from the phosphor film layer may be achieved mechanically by use of tools such as a knife blade or for example by using a chemical treatment or heat treatment as needed. Other techniques may also be used.

The adhesive transfer method disclosed herein and variations of this method may be repeated to apply multiple layers of phosphor film sequentially. For example, a first layer of phosphor film may be applied to the substrate, a second layer of phosphor film may be then be applied to the first layer of phosphor film and a third layer of phosphor film may be applied to the second layer of phosphor film. Each layer of phosphor film may be applied using the adhesive transfer method.

The composite layered structure may further include a heat dissipation layer. In certain aspects, the heat dissipation layer and at least a portion of the color conversion layer are integrated. For example, each of the heat dissipation layer and the at least a portion of the color conversion layer comprise a powder mixed with each other. As a further example, the heat dissipation layer may comprise boron nitride, aluminum nitride, aluminum oxide, silicon nitride, or silicon carbide powder. As an example, FIG. 7 illustrates various sample materials and formulations that may be used as the heat dissipation layer. In other aspects, the heat dissipation layer is interposed between the color conversion layer and an organic light emitting diode. Alternatively, the color conversion layer is interposed between the heat dissipation layer and the organic light emitting diode.

The composite layered structure may further include a hard coating layer disposed such that each of the heat dissipation layer and the color conversion layer are interposed between the hard coating layer and an organic light emitting diode. The hard coating layer may include polyethylene terephthalate, polycarbonate, polymethylmethacrylate, polyurethane, polystyrene, polypropylene, polyetherimide, or a combination thereof. Other materials and coatings may be used. In certain aspects, the hard coating layer is formed using an adhesive transfer method.

Light-emitting devices, including organic light emitting devices (OLEDs) that produce white light are disclosed herein. In one aspect of the present disclosure, hybrid OLEDs or OLEDs that use a blue emitting layer and a color conversion layer containing one or more phosphor film layers are disclosed herein. Although the discussion of particular aspects relates to OLEDs, it will be understood by those skilled in the art that the disclosure is in fact applicable to any device, especially those emitting light, and especially those emitting white light.

The light-emitting device may include a composite layered structure comprising a substrate and one or more layers of phosphor film disposed on the substrate. The light-emitting device further includes a light emitting diode (LED) disposed on the substrate opposite the phosphor film layers. The light-emitting device may further include at least one whitening layer. The whitening layer is disposed over the LED and the one or more layers of phosphor film.

In one aspect of the present disclosure, the one or more whitening layers are configured to provide the light-emitting device with a white appearance when the device is in its off-state. The light-emitting device may have an on-state wherein the device emits light and an off-state wherein the device does not emit any light. When the light-emitting device is in its on-state, the LED is illuminated. Conversely, when the light-emitting device is in its off-state, the LED is not illuminated. In one aspect of the present disclosure, the light-emitting device emits white light in its on-state. In another aspect, the light-emitting device does not emit any light in its off-state but has white appearance in its off-state. The light-emitting device may be powered by a variety of methods known in the art. For example, the LED may be connected to a circuit or an element that provides current to the LED thereby illuminating the LED when the device is turned on.

In one aspect, the LED is a blue LED or blue light emitting diode, also referred to as a blue light emitter and is configured to emit blue light. For example, the LED emits light in the blue portion of the visible spectrum approximately 400 nm-480 nm. As set forth above, the emission of blue light may be used to produce white light. The present disclosure may, however, be implemented using various illumination sources such as fluorescent lights or light emitting diodes that use arrays of red, green or blue LEDs. In one aspect of the disclosure, the light emitting device may use an array of red, green, and blue LEDs that collectively produce white light. For example, aspects of the present disclosure contemplate use of any color emitter.

In some aspects, the light-emitting device may include one LED or more than one LED. Any semiconductor material known in the art may be used to form the LED. For example, gallium nitride (GaN) may be used to form a blue LED for use with the present disclosure. The color of the light emitted from the LED is generally a function of the semiconductor materials used to form the LED. The LED may emit light in various configurations and the disclosure is not limited in this regard. For example, the LED may be a bottom-emitting LED, a top-emitting LED, a side-emitting LED or a combination thereof.

EXAMPLES

FIG. 1 shows the schematic of a stacking configuration (e.g., a stacked film) including a phosphor layer 100 disposed adjacent one or more optically clear adhesive (OCA) layers 102. The phosphor layer 100 may be configured as a film with the one or more OCA layers 102. In certain aspects, one of the OCA layers 102 may be configured as a substrate onto which the phosphor layer 100 may be disposed, for example, using adhesive transfer (AT).

As an example, the OCA layers 102 may be or comprise an optically clear lamination adhesive such as an acrylic adhesive. The phosphor layer 100 may be fabricated using YAG:Ce yellow powder phosphors and OCA-assisted protection layer via an AT method. As the phosphor materials, red, green and yellow powder phosphors can be used diversely. The AT method facilitates coating layer by layer (multi-layer) and provides high surface packing density of phosphors. A hard coating or protection layer 104 (such as, for example but not to be limiting, a PET film) may be disposed adjacent the phosphor layer 100 and/or the OCA layer 102. The protection layer 104 may provide scratch protection of the phosphor layer 100.

FIGS. 2A-2B show schematic representations of stacking configurations (e.g., a stacked film) of a phosphor layer 200 and heat dissipation layer 203. As shown, the heat dissipation layer 203 may be disposed below (FIG. 2A) and/or above (FIG. 2B) the phosphor layer 200, respectively, by using an AT method. The heat dissipation layer 203 may comprise boron nitride, aluminum nitride, aluminum oxide, silicon nitride, or silicon carbide powder. One or more OCA layers 202 may be disposed adjacent one or more of the phosphor layer 200 and the heat dissipation layer 203. A hard coating or protection layer 204 (e.g., PET film) may be disposed adjacent the phosphor layer 200, the heat dissipation layer 203, and/or the OCA layer 202. The protection layer 204 may provide scratch protection of the other layers.

Figure 3A:
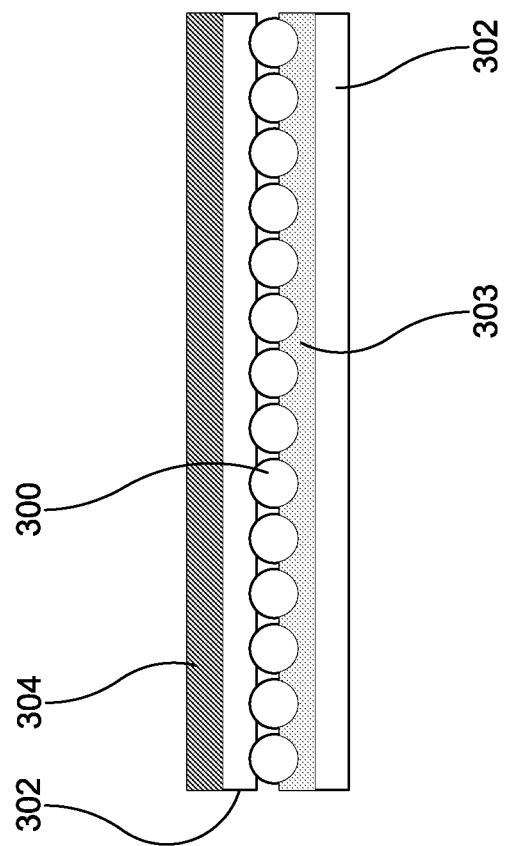

FIGS. 3A-3B are schematic representations of stacking configurations (e.g., a stacked film) of a phosphor layer 300 and a heat dissipation layer 303 integrated, or mixed, with an optically clear resin (OCR). The mixed heat dissipation layer 303 (with OCR) may be disposed below (FIG. 3A) and/or above (FIG. 3B) the phosphor layer 300, respectively, through an AT method. The mixed heat dissipation layer 303 with various concentrations may be fabricated by controlling the concentration of heat dissipation powders into an OCR. One or more OCA layers 302 may be disposed adjacent one or more of the phosphor layer 300 and the mixed heat dissipation layer 303. A hard coating or protection layer 304 (e.g., PET film) may be disposed adjacent the phosphor layer 300, the heat dissipation layer 303, and/or the OCA layer 302. The protection layer 304 may provide scratch protection of the other layers.

Figure 4:
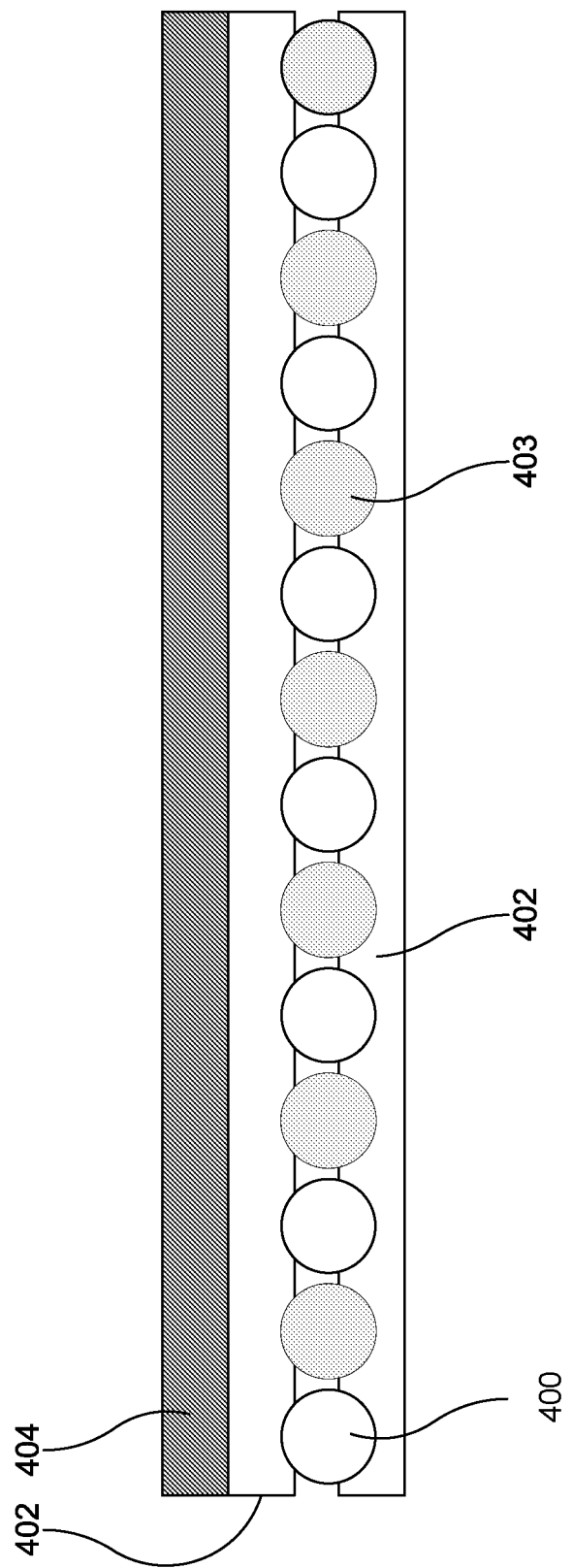
FIG. 4 is a schematic representation of a composite layered structure according to aspects of the present disclosure.
Figure 5A:
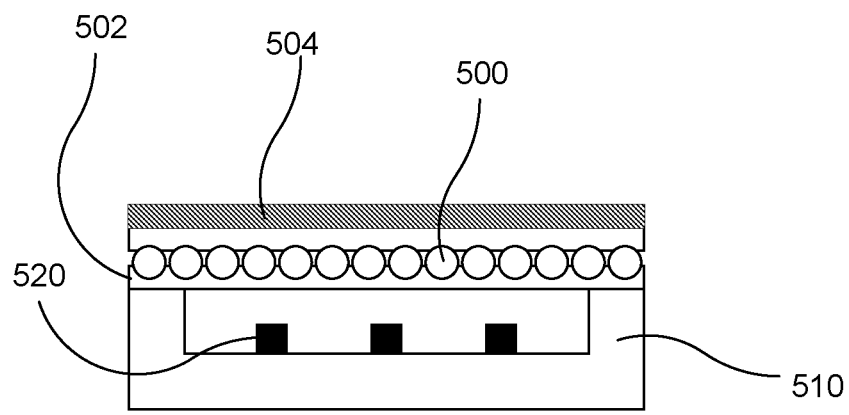
FIGS. 5A-F are schematic representations of various light emitting devices including composite layered structures according to aspects of the present disclosure.
Figure 5B:
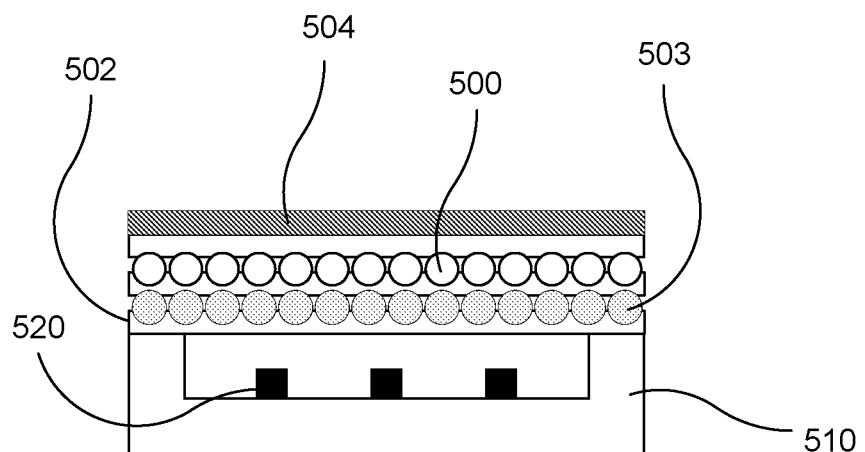
Figure 5C:
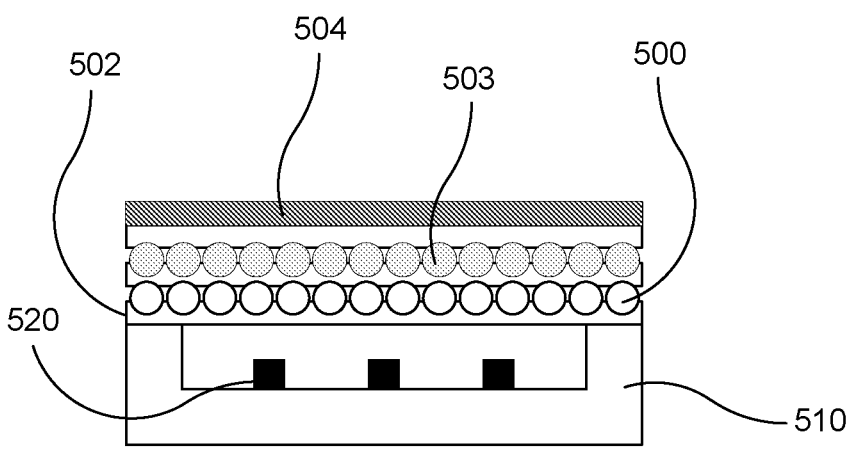
Figure 5D:
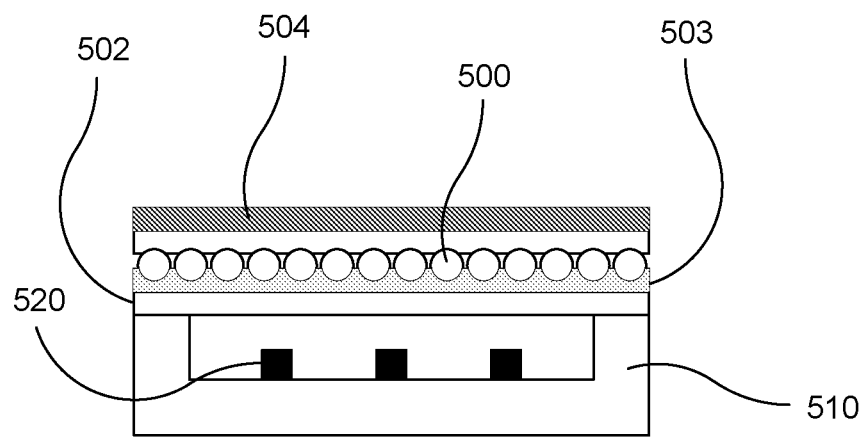
Figure 5E:
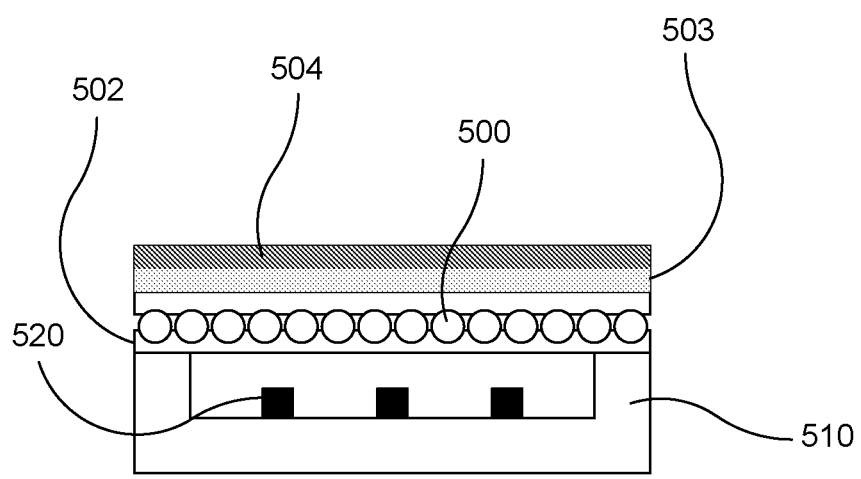
Figure 5F:
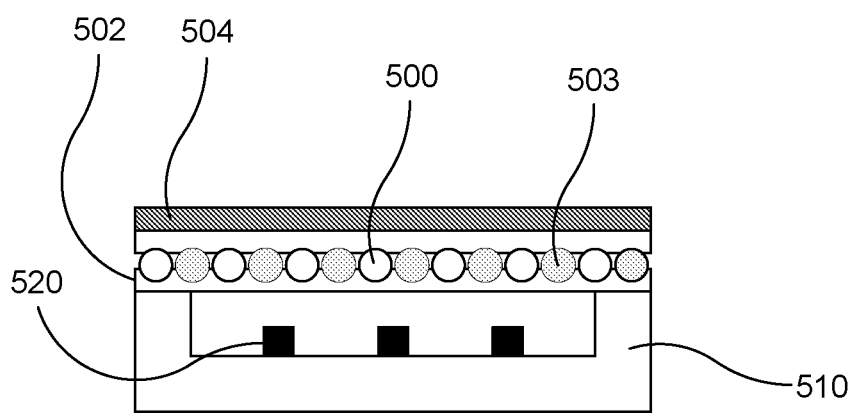

FIG. 4 illustrates a schematic representation of a mixed/integrated stacking configuration (e.g., a stacked film) of phosphor powder and heat dissipation powder to form an integrated (mixed) phosphor layer 400 (shown as clear dots) and heat dissipation layer 403 (shown as shaded dots). Such mixed phosphor layer 400 with heat dissipation layer 403 may be fabricated by AT method using a compound, which may be a mixture of a phosphor powder and a heat dissipation material (e.g., powder) with various concentrations. The mixed phosphor layer 400 mixed with heat dissipation layer 403 may exhibit higher thermal conductivity than the phosphor layer 400 without the mixed heat dissipation layer 403. As an example, thermal conductivity may be measured in accordance with a laser flash analysis system. Thermal diffusivity using laser flash analysis may be determined according to formula (I).

$$\alpha = 0.1388 \cdot \frac{d^2}{t_{1/2}} \qquad (I)$$

wherein a is the thermal diffusivity in square centimeters per second (cm2/s); d is the thickness of the sample in centimeters (cm), and t½ is the time to the half maximum in seconds (s).

In one example, an energy pulse (i.e., a laser) heats one side of a plane-parallel sample. The temperature rise on an opposing side of the sample due to the energy input is time-dependent detected. Thermal conductivity of the sample may then be calculated based on formula (II):

$$\lambda(T)=a(T)*C_p(T)*\rho(T) \qquad (II)$$

wherein λ is thermal conductivity, a is thermal diffusivity. $C_p$ is specific heat, and p is density. Thermal conductivity may be expressed in watts per meter kelvin (W/m·K). Other methods may be used.

These phosphor films with heat dissipation film may exhibit higher thermal stability than the phosphor film without heat dissipation film. Thermal stability, as used herein, may be defined as a change in thermal conductivity below a threshold over a temperature range. As an example, the thermal stability of example CCL layers including a phosphor layer and heat dissipation layer according to aspects of the present disclosure are illustrated in FIG. 6. As shown, the CCL layers of the present disclosure exhibit a change in thermal stability of less than about 10% over a temperature range of 25° C. to 120° C., for example 0.148 watts per W/m·K to 0.157 W/m·K (i.e., a 6% change). In particular, the sample CCL_550(1) represents a PET substrate film adhesive layer coupled to a phosphor layer (Y-550); the sample CCL_550(1)_P represents a PET substrate film adhesive layer coupled to a phosphor layer (Y-550) with protection layer of PET with adhesive disposed opposite the substrate film to sandwich the phosphor layer there between; the sample CCL_550(2) represents a PET substrate film adhesive layer coupled to a phosphor layer (Y-550) with a second stack of PET substrate film adhesive layer coupled to a phosphor layer (Y-550) disposed in a two layer stacking configuration (i.e., a stacked film).

Returning to FIG. 4, one or more OCA layers 402 may be disposed adjacent one or more of the phosphor layer 400 and the heat dissipation layer 403. A hard coating or protection layer 404 (e.g., PET film) may be disposed adjacent the phosphor layer 400, the heat dissipation layer 403, and/or the OCA layer 402. The protection layer 404 may facilitate scratch protection of the other layers.

As described herein, the heat dissipation layer 203, 303, 403, can function to improve the efficiency of phosphor layers 200, 300, 400 due to its scattering effect as well as to whiten the exterior yellow color of phosphor layers 200, 300, 400. As an example, FIG. 8 illustrates the power efficiency (PE) and external quantum efficiency (EQE) of various configurations of light emitting devices/stacks. Efficiency measurements may be made using LM-79 test method. The LM-79 is the Illuminating Engineering Society of North America (IESNA) approved method for the Electrical and Photometric Measurements of Solid State Lighting. An integrating sphere system may be used to measure the total luminous flux and color with spectrophotometer.

A light emitting device may be formed including one or more of the stack configurations described herein. As an example, FIGS. 5A-5F illustrate various schematic representations of an exemplary LED package disposed to emit light through one or more of the stacking configurations illustrated in FIGS. 1-4 and incorporating various phosphor layers 100, 200, 300, 400, 500 and/or heat dissipation layers 203, 303, 403, 503 and/or OCA layer 102, 202, 302, 402, 502, and/or protection layer 104, 204, 304, 404, 504. The exemplary LED package includes a substrate 510, a plurality of LEDs 520 located on or within the substrate 520, and one of the stacking configurations of FIGS. 1-4 located proximate the substrate 520. As such, a light emitting device including a multifunctional phosphor layer may be realized that exhibits higher thermal stability and higher efficiency, and exterior white color, by adding the heat dissipation layer for LED and OLED application and future industrial applications.

An LED or a LED package or stack formed from the films or configurations of the present disclosure may achieve a particular power efficiency. The light-emitting device may exhibit a power efficiency of between about 30 lumens per watt (lm/W) and about 150 lm/W when tested in accordance with the L-79 test method.

Definitions

It is to be understood that the terminology used herein is for the purpose of describing particular aspects only and is not intended to be limiting. As used in the specification and in the claims, the term "comprising" can include the embodiments "consisting of" and "consisting essentially of." Unless defined otherwise, all technical and scientific terms used herein have the same meaning as commonly understood by one of ordinary skill in the art to which this disclosure belongs. In this specification and in the claims which follow, reference will be made to a number of terms which shall be defined herein.

As used in the specification and the appended claims, the singular forms "a," "an" and "the" include plural equivalents unless the context clearly dictates otherwise. Thus, for example, reference to "a polycarbonate polymer" includes mixtures of two or more polycarbonate polymers.

As used herein, the term "combination" is inclusive of blends, mixtures, alloys, reaction products, and the like.

Ranges can be expressed herein as from one particular value to another particular value. When such a range is expressed, another aspect includes from the one particular value and/or to the other particular value. Similarly, when values are expressed as approximations, by use of the antecedent 'about,' it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "about" and "at or about" mean that the amount or value in question can be the value designated some other value approximately or about the same. It is generally understood, as used herein, that it is the nominal value indicated ±5% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

Disclosed are the components to be used to prepare films of the disclosure as well as the films themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the disclosure. Thus, if there are a variety of additional steps that can be performed it is understood that each of these additional steps can be performed with any specific aspect or combination of aspects of the methods of the disclosure.

As used herein, "allylate" refers to any salt or ester of an allylic carboxylic acid, i.e., one containing an allyl radical. Allyl refers to the univalent radical $CH_2=CH-CH_2-$.

As used herein, "YAG:Ce" refers to cerium-doped YAG. YAG is yttrium aluminum garnet ($Y_3Al_5O_{12}$).

As used herein, the term "transparent" or "optically clear" means that the level of transmittance for a disclosed composition is greater than 50%. In some aspects, the transmittance can be at least 60%, 70%, 80%, 85%, 90%, or 95%, or any range of transmittance values derived from the above exemplified values. In the definition of "transparent", the term "transmittance" refers to the amount of incident light that passes through a sample measured in accordance with ASTM D1003 at a thickness of 3.2 millimeters.

The term "adhesive" as used herein refers to a sticky, gluey or tacky substance capable of adhering two films together. In particular aspects, the adhesive is transparent. In the adhesive, desiccant material can be added for improving water vapor transmission rate (WVTR) values for the film. Ultraviolet (UV) or thermal energy may be necessary for curing adhesive layer.

Unless otherwise stated to the contrary herein, all test standards are the most recent standard in effect at the time of filing this application.

Aspects

The present disclosure comprises at least the following aspects.

Aspect 1. A light-emitting device comprising: a substrate comprising an optically clear adhesive or an optically clear resin; an organic light emitting diode disposed adjacent the substrate and configured to emit light through the substrate; a color conversion layer disposed adjacent a side of the substrate opposite the organic light emitting diode, wherein the color conversion layer comprises phosphor and is disposed on the substrate using an adhesive transfer method; and a heat dissipation layer disposed adjacent the color conversion layer, wherein the heat dissipation layer is formed using the adhesive transfer method, and wherein the light-emitting device exhibits improved thermal stability as compared to a comparative light-emitting device consisting essentially of the substrate, the organic light emitting diode, and the color conversion layer without the heat dissipation layer, and wherein the light-emitting device exhibits a power efficiency of between about 30 lm/W and about 150 lm/W measured using L-79 test method.

Aspect 1. A light-emitting device consisting essentially of: a substrate comprising an optically clear adhesive or an optically clear resin; an organic light emitting diode disposed adjacent the substrate and configured to emit light through the substrate; a color conversion layer disposed adjacent a side of the substrate opposite the organic light emitting diode, wherein the color conversion layer comprises phosphor and is disposed on the substrate using an adhesive transfer method; and a heat dissipation layer disposed adjacent the color conversion layer, wherein the heat dissipation layer is formed using the adhesive transfer method, and wherein the light-emitting device exhibits improved thermal stability as compared to a comparative light-emitting device consisting essentially of the substrate, the organic light emitting diode, and the color conversion layer without the heat dissipation layer, and wherein the light-emitting device exhibits a power efficiency of between about 30 lm/W and about 150 lm/W measured using L-79 test method.

Aspect 2. A light-emitting device consisting of: a substrate comprising an optically clear adhesive or an optically clear resin; an organic light emitting diode disposed adjacent the substrate and configured to emit light through the substrate; a color conversion layer disposed adjacent a side of the substrate opposite the organic light emitting diode, wherein the color conversion layer comprises phosphor and is disposed on the substrate using an adhesive transfer method; and a heat dissipation layer disposed adjacent the color conversion layer, wherein the heat dissipation layer is formed using the adhesive transfer method, and wherein the light-emitting device exhibits improved thermal stability as compared to a comparative light-emitting device consisting essentially of the substrate, the organic light emitting diode, and the color conversion layer without the heat dissipation layer, and wherein the light-emitting device exhibits a power efficiency of between about 30 lm/W and about 150 lm/W measured using L-79 test method.

Aspect 3. The light-emitting device of aspect 1, wherein the heat dissipation layer and at least a portion of the color conversion layer are integrated.

Aspect 4. The light-emitting device of aspect 1, wherein the heat dissipation layer comprises boron nitride, aluminum nitride, aluminum oxide, silicon nitride, silicon carbide powder, or a combination thereof.

Aspect 5. The light-emitting device of aspect 1, wherein the heat dissipation layer is interposed between the color conversion layer and the organic light emitting diode or wherein the color conversion layer is interposed between the heat dissipation layer and the organic light emitting diode.

Aspect 6. The light-emitting device of aspect 1, wherein the substrate and the color conversion layer are formed as a stacked film.

Aspect 7. A light-emitting device comprising: a substrate; an organic light emitting diode disposed adjacent the substrate; a color conversion layer disposed adjacent a side of the substrate opposite the organic light emitting diode; and a heat dissipation layer disposed adjacent the color conversion layer, wherein one or more of the color conversion layer and the heat dissipation layer are formed using adhesive transfer, and wherein the light-emitting device exhibits improved thermal stability and power efficiency as compared to a comparative light-emitting device consisting essentially of the substrate, the organic light emitting diode, and the color conversion layer without the heat dissipation layer.

Aspect 8. The light-emitting device of aspect 7, wherein the color conversion layer comprises powder phosphor.

Aspect 9. The light-emitting device of aspect 8, wherein the phosphor powder is selected from the group consisting of red, green, and yellow phosphor powder.

Aspect 10. The light-emitting device of aspect 7, wherein the color conversion layer comprises YAG-Ce yellow powder phosphor.

Aspect 11. The light-emitting device of any one of aspects 7-10, wherein the heat dissipation layer and at least a portion of the color conversion layer are integrated.

Aspect 12. The light-emitting device of aspect 11, wherein each of the heat dissipation layer and the at least a portion of the color conversion layer comprise a powder mixed with each other.

Aspect 13. The light-emitting device of any one of aspects 7-12, wherein the heat dissipation layer comprises boron nitride, aluminum nitride, aluminum oxide, silicon nitride, or silicon carbide powder.

Aspect 14. The light-emitting device of any one of aspects 7-12, wherein the heat dissipation layer is interposed between the color conversion layer and the organic light emitting diode.

Aspect 15. The light-emitting device of any one of aspects 7-12, wherein the color conversion layer is interposed between the heat dissipation layer and the organic light emitting diode.

Aspect 16. The light-emitting device of any one of aspects 7-15, wherein the substrate comprises an optically clear adhesive or an optically clear resin.

Aspect 17. The light-emitting device of aspect 16, wherein the optically clear adhesive or the optically clear resin comprises acrylate, PAA (polyacrylic acid), silicone, urethane, or epoxy groups, or a combination thereof.

Aspect 18. The light-emitting device of any one of aspects 1-17, further comprising a hard coating layer disposed such that each of the heat dissipation layer and the color conversion layer are interposed between the hard coating layer and the organic light emitting diode, wherein the hard coating layer comprises polyethylene terephthalate, polycarbonate, polymethylmethacrylate, polyurethane, polystyrene, polypropylene, polyetherimide, or a combination thereof.

Aspect 19. The light-emitting device of claim 18, wherein the color conversion layer, the heat dissipation layer, and the hard coating layer are affixed to the substrate using an adhesive transfer method.

Aspect 20. The light-emitting device of any one of aspects 1-10 and 13-18, further comprising an optically clear resin disposed between the color conversion layer and the heat dissipation layer.

Aspect 21. A method of forming the light-emitting device of any one of aspects 1-19.

Aspect 22. The light-emitting device of any one of aspects 1-20, wherein the light emitting diode is an organic light emitting diode and wherein the light-emitting device exhibits a power efficiency of between about 50 lm/W and about 100 lm/W measured using L-79 test method.

Aspect 23. The light-emitting device of any one of aspects 1-20, wherein the light-emitting device exhibits a power efficiency of between about 70 lm/W and about 130 lm/W measured using L-79 test method.

What is claimed is:

1. A light-emitting device comprising:
    a substrate comprising an optically clear adhesive or an optically clear resin;
    a light emitting diode disposed adjacent the substrate and configured to emit light through the substrate;
    a color conversion layer disposed adjacent a side of the substrate opposite the light emitting diode, wherein the color conversion layer comprises phosphor and is disposed on the substrate using an adhesive transfer method;
    a heat dissipation layer disposed adjacent the color conversion layer, wherein the heat dissipation layer is formed using the adhesive transfer method; and
    an optically clear resin disposed between the color conversion layer and the heat dissipation layer,
    wherein the light-emitting device exhibits improved thermal stability as compared to a comparative light-emitting device consisting essentially of the substrate, the light emitting diode, and the color conversion layer without the heat dissipation layer, and
    wherein the light-emitting device exhibits a power efficiency of between about 30 lm/W and about 150 lm/W measured using L-79 test method.

2. The light-emitting device of claim 1, wherein the heat dissipation layer comprises boron nitride, aluminum nitride, aluminum oxide, silicon nitride, silicon carbide powder, or a combination thereof.

3. The light-emitting device of claim 1, wherein the heat dissipation layer is interposed between the color conversion layer and the light emitting diode or wherein the color conversion layer is interposed between the heat dissipation layer and the light emitting diode.

4. The light-emitting device of claim 1, wherein the substrate and the color conversion layer are formed as a stacked film.

5. The light-emitting device of claim 1, further comprising a hard coating layer disposed such that each of the heat dissipation layer and the color conversion layer are interposed between the hard coating layer and the light emitting diode, wherein the hard coating layer comprises polyethylene terephthalate, polycarbonate, polymethylmethacrylate, polyurethane, polystyrene, polypropylene, polyetherimide, or a combination thereof.

6. The light-emitting device of claim 5, wherein the color conversion layer, the heat dissipation layer, and the hard coating layer are affixed to the substrate using an adhesive transfer method.

7. A method of forming the light-emitting device of claim 1.

8. A light-emitting device comprising:
a substrate;
a light emitting diode disposed adjacent the substrate;
a color conversion layer disposed adjacent a side of the substrate opposite the light emitting diode;
a heat dissipation layer disposed adjacent the color conversion layer; and
an optically clear resin disposed between the color conversion layer and the heat dissipation layer,
wherein one or more of the color conversion layer and the heat dissipation layer are formed using adhesive transfer, and wherein the light-emitting device exhibits improved thermal stability and power efficiency as compared to a comparative light-emitting device consisting essentially of the substrate, the light emitting diode, and the color conversion layer without the heat dissipation layer.

9. The light-emitting device of claim 8, wherein the color conversion layer comprises phosphor powder.

10. The light-emitting device of claim 9, wherein the phosphor powder is selected from the group consisting of red, green, and yellow phosphor powder.

11. The light-emitting device of claim 8, wherein the color conversion layer comprises cerium doped yttrium-aluminum-garnet yellow phosphor powder.

12. The light-emitting device of claim 8, wherein the heat dissipation layer comprises boron nitride, aluminum nitride, aluminum oxide, silicon nitride, or silicon carbide powder.

13. The light-emitting device of claim 8, wherein the heat dissipation layer is interposed between the color conversion layer and the light emitting diode.

14. The light-emitting device of claim 8, wherein the color conversion layer is interposed between the heat dissipation layer and the light emitting diode.

15. The light-emitting device of claim 8, wherein the substrate comprises an optically clear adhesive or an optically clear resin.

16. The light-emitting device of claim 15, wherein the optically clear adhesive or the optically clear resin comprises acrylate, PAA (polyacrylic acid), silicone, urethane, or epoxy groups, or a combination thereof.

* * * * *